United States Patent

Ma

(10) Patent No.: US 9,252,278 B2
(45) Date of Patent: Feb. 2, 2016

(54) ARRAY SUBSTRATE, DISPLAY DEVICE AND MANUFACTURING METHOD THEREOF

(71) Applicant: BOE Technology Group Co., Ltd., Beijing (CN)

(72) Inventor: Zhanjie Ma, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 58 days.

(21) Appl. No.: 14/063,128

(22) Filed: Oct. 25, 2013

(65) Prior Publication Data
US 2014/0117370 A1   May 1, 2014

(30) Foreign Application Priority Data
Oct. 31, 2012  (CN) .......................... 2012 1 0430039

(51) Int. Cl.
| | | |
|---|---|---|
| H01L 27/14 | (2006.01) | |
| H01L 29/04 | (2006.01) | |
| H01L 29/15 | (2006.01) | |
| H01L 31/036 | (2006.01) | |
| H01L 29/786 | (2006.01) | |
| H01L 27/12 | (2006.01) | |
| H01L 29/66 | (2006.01) | |

(52) U.S. Cl.
CPC ............ *H01L 29/786* (2013.01); *H01L 27/124* (2013.01); *H01L 27/1288* (2013.01); *H01L 29/6675* (2013.01)

(58) Field of Classification Search
CPC . H01L 29/6675; H01L 29/786; H01L 27/124; H01L 27/1288
See application file for complete search history.

(56) References Cited

U.S. PATENT DOCUMENTS

| 5,191,453 A | 3/1993 | Okumura |
|---|---|---|
| 6,175,395 B1 | 1/2001 | Yamazaki et al. |
| 2004/0263704 A1 | 12/2004 | Oh et al. |
| 2007/0002195 A1 | 1/2007 | Cho |

FOREIGN PATENT DOCUMENTS

CN            102683338 A        9/2012

OTHER PUBLICATIONS

The State Intellectual Property Office of the People's Republic of China ("SIPO") (Chinese language) first office action issued on Oct. 27, 2014 by SIPO in Chinese Patent Application 201210430039.8. Seven (7) pages.
English Translation of the State Intellectual Property Office of the People's Republic of China ("SIPO") (Chinese language) second office action issued on Oct. 27, 2014 by SIPO in Chinese Patent Application 201210430039.8. Eight (8) pages.
English abstract of CN102683338A; One (1) page.
Extended European Search Report for European Patent Application No. 13190303.1 dated Feb. 4, 2014, 6pgs.

(Continued)

*Primary Examiner* — Meiya Li
(74) *Attorney, Agent, or Firm* — Ladas & Parry LLP

(57) ABSTRACT

A manufacturing method of an arrayed substrate is disclosed, in which ion-doping is performed by using photoresist as a barrier layer instead of using a gate electrode, which process can reduces the short channel effect that is caused by diffusion of doped ions toward a channel region, and meanwhile decrease the coupling capacitance between the gate electrode and the source-drain electrodes, thereby improving the performance of the prepared TFT.

8 Claims, 4 Drawing Sheets

(56) References Cited

OTHER PUBLICATIONS

The State Intellectual Property Office of the People's Republic of China ("SIPO") (Chinese language) second office action issued on Jan. 15, 2015 by SIPO in Chinese Patent Application 201210430039.8. Six (6) pages.

English Translation of the State Intellectual Property Office of the People's Republic of China ("SIPO") (Chinese language) second office action issued on Jan. 15, 2015 by SIPO in Chinese Patent Application 201210430039.8. Eight (8) pages.

Third Chinese Office Action dated Apr. 21, 2015: Appln. No. 201210430039.8.

Fourth Chinese Office Action dated Aug. 7, 2015; Appln. No. 201210430039.8.

ARRAY SUBSTRATE, DISPLAY DEVICE AND MANUFACTURING METHOD THEREOF

CROSS REFERENCE TO RELATED APPLICATIONS

This application claims priority from Chinese National Application No. 201210430039.8 filed on Oct. 31, 2012, the contents of which are incorporated herein by reference.

TECHNICAL FIELD

Embodiments of the present technical disclosure relate to an array substrate, a manufacturing method thereof, and a display device having the array substrate.

BACKGROUND

Thin film transistors (TFTs) can be divided into polycrystalline silicon (P-Si) TFTs and amorphous silicon (a-Si) TFTs, and the difference between these kinds lies in the characteristics of an active layer. The P-Si crystalline structure within a grain is ordered and directional, so the carrier mobility therein is 200-300 times faster than that in amorphous silicon, in which the crystalline structure is arranged disordered. P-Si products mainly include two types of products: high-temperature Poly-Silicon (HTPS) and low-temperature Poly-Silicon (LTPS), and these two types can basically be divided depending on the crystallization temperature higher or lower than 600 degrees Celsius.

LTPS technology is the a new generation of manufacturing process of a TFT display, which mainly uses processes such as excimer laser annealing (ELA), metal induced crystallization (MIC) or solid phase crystallization (SPC) to convert an a-Si thin film into a P-Si thin film layer. A display using LTPS TFTs as driving elements has a faster response, a higher resolution, and thus has a better picture display quality. In the formation of the peripheral circuit of a display device, the LTPS technology can be used to reduce amount of the integrated circuits (IC), and thus simplify the periphery of the display device, so as to realize a narrow-frame technology.

As illustrated in FIG. 1, a conventional LTPS TFT array substrate comprises from bottom to top: a glass substrate 101, a buffer layer 102, a channel region 103, a gate insulating layer 105, a gate electrode 106, source-drain electrodes 104, an interlayer insulating layer 107, a passivation layer 108, a pixel electrode layer 109 and a pixel electrode insulating protective layer 110. The pixel electrode insulating protective layer 110 is applicable for LTPS AMOLED (Active Matrix Organic Light Emitting Diode), but if the product is an LTPS LCD (Liquid Crystal Display), then it may not comprise such layer. The traditional preparation process of an LIPS TFT array substrate is a 7-Mask process, which may comprise the following processes. Each mask is used in one patterning process.

A first mask (P-Si Mask): a pattern for both a TFT source-drain region and a channel region is formed.

Firstly, on the glass substrate 101, a SiNx/SiO$_2$ buffer layer 102 is formed, then a layer of amorphous silicon (a-Si) thin film is deposited on the buffer layer 102, and through an LTPS crystallization method (such as ELA, MIC, SPC or the like), the amorphous silicon thin film is converted into a polycrystalline silicon thin film. Then, a photoresist layer is coated on the Poly-Silicon thin film; with the first Mask, the photoresist layer is exposed corresponding to an active layer pattern, and after exposure, it is developed to obtain a photoresist pattern; then, by using the photoresist pattern, the Poly-Silicon thin film is etched, and after removing the remaining photoresist, the channel region 103 is thus obtained.

A second mask (gate-metal-layer Mask): the gate electrode pattern 106 and the gate line pattern (not illustrated) are formed.

On the basis of the pattern formed with the first Mask, a gate insulating layer thin film 105 and a gate metal layer thin film are deposited, and the gate insulating layer thin film 105 may be of SiO$_2$/SiNx; then, the gate metal layer thin film is coated thereon with photoresist, and with the second Mask, the photoresist layer is exposed; after developing, etching, photoresist-removing, the gate electrode pattern 106 and the gate line pattern are formed.

On the basis of the pattern formed with the second Mask, with the gate electrode pattern above the channel region pattern 103 as an ion-doping barrier layer, ion-doping is performed with respect to the source-drain region, as illustrated in FIG. 2-1. After ion-doping, an ion-doped region 111 is formed in the source-drain region. By ion-doping, the original regularly-crystallized Poly-Silicon crystal lattice is destroyed; in order to repair the Poly-Silicon crystal lattice, the Poly-Silicon layer should undergo an annealing treatment. The annealing treatment functions for restructuring Poly-Silicon crystal lattice and diffusing dopant-ions, as illustrated in FIG. 2-2. In the annealing process, dopant-ions will diffuse in the direction of the channel region 103 (illustrated by the arrows), as illustrated in FIG. 2-3.

A third Mask (gate insulating layer via-hole (GI Hole) Mask): contact holes for Poly-Silicon in the source-drain region and the source-drain electrodes are formed.

On the pattern after the complete of the second Mask, an interlayer insulating layer 107 is formed; then, the interlayer insulating layer 107 is coated thereon with photoresist, and with the third Mask, the photoresist layer is exposed corresponding to the source-drain electrode via-holes; after exposure, a development process and then an etching process are conducted, and at last the photoresist is removed.

The fourth mask (source-drain metal layer Mask): the source-drain electrode pattern 104 and the data line pattern (not illustrated) are formed.

On the basis of the pattern formed with the third mask, a source-drain metal layer thin film is deposited; then, the metal layer thin film is coated thereon with photoresist, and with the fourth mask, the photoresist layer undergoes exposure, development, etching, photoresist-removing; in this way, the formation of the source-drain electrode pattern 104 and the data line pattern is completed.

A fifth Mask (passivation layer via-hole (PVX Hole) Mask): bridge-holes for bridging the source-drain electrode pattern 104 are formed.

On the basis of the pattern formed with the fourth Mask, a passivation layer 108 is deposited; with the fifth mask, passivation layer via-holes are formed on the passivation layer 108.

A sixth Mask (pixel electrode Mask): the pixel electrode pattern 109 is formed.

On the basis of the pattern formed with the fifth Mask, a pixel electrode layer thin film is deposited; with the sixth Mask, it undergoes exposure, development, etching and photoresist-removing, thereby forming the pixel electrode pattern 109.

A seventh Mask (pixel electrode edge protection layer Mask): the pixel edge protective layer pattern is formed.

On the basis of the pattern formed with the sixth Mask, a protective layer thin film is deposited; with the seventh Mask, an exposure process is conducted, and then a development process, an etching process and a photoresist-removing process are conducted, thereby forming the pixel edge protective layer pattern. This mask is applicable for the preparation of an LTPS AMOLED; but if it is an LTPS LCD, then it is not necessary to use this mask in the preparation process for the corresponding patterning process.

In the above-described conventional manufacturing process of an LTPS TFT array substrate, by using the gate electrode as a barrier layer for ion-doping with respect to the source-drain region, the doped ions are adjacent to the channel region. In the Poly-Silicon annealing process, the doped ions partially diffuse toward the channel region, thereby decreasing the effective length of the channel region (the shortest distance between the source-drain regions). This not only makes the short channel effect of the channel region obvious, but also increases the coupling capacitance between the gate and source-drain, thereby degrading the TFT performance. In addition, such structure that the gate electrode and the gate line, also the source-drain electrode and the data line, exist respectively in two different layers, makes the preparation process complex.

SUMMARY

Embodiments of the present technical disclosure provide an array substrate, a display device, and a manufacturing method thereof, which can reduce a TFT short channel effect that is caused by diffusion of doped ions from ion-doping regions of a Poly-Silicon layer toward a channel region and additionally reduce the number of used Masks in a manufacturing process and thus simplify the manufacturing process.

In one aspect of the present technical disclosure, there is provided an array substrate, comprising: a base substrate, a Poly-Silicon layer, a gate insulating layer and a metal layer. The Poly-Silicon layer is disposed above the base substrate and comprises a channel region and ion-doped regions on both sides of the channel region; the gate insulating layer is disposed on the Poly-Silicon layer; the metal layer comprises a gate electrode, a source electrode, a drain electrode, a gate line and a data line, which are made of a same layer of metallic material.

In another aspect of the present technical disclosure, there is provided a display device comprising the array substrate described above.

In a further aspect of the present technical disclosure, there is also provided a method of manufacturing an array substrate, and the method comprises: forming a Poly-Silicon layer pattern on a base substrate, wherein the Poly-Silicon layer pattern comprises a channel region and ion-doped regions on both sides of the channel region; forming a gate insulating layer pattern on the Poly-Silicon layer, and performing ion-doping with respect to the ion-doped regions by using photoresist coated above the channel region as a barrier layer; and forming a metal layer on the gate insulating layer, and forming the metal layer into a pattern comprising a gate electrode, a source electrode, a drain electrode, a gate line and a data line.

Further scope of applicability of the present technical disclosure will become apparent from the detailed description given hereinafter. However, it should be understood that the detailed description and specific examples, while indicating preferred embodiments of the technical disclosure, are given by way of illustration only, since various changes and modifications within the spirit and scope of the technical disclosure will become apparent to those skilled in the art from the following detailed description.

BRIEF DESCRIPTION OF THE DRAWINGS

The present technical disclosure will become more fully understood from the detailed description given hereinafter and the accompanying drawings which are given by way of illustration only, and thus are not limitative of the present technical disclosure and wherein:

FIG. 2-1 to FIG. 2-3 are schematic diagrams illustrating partial principle of the conventional preparation process of the LTPS TFT array substrate;

FIGS. 3-1 and 3-3 are schernatic plan views of an embodiment of the array substrate described according to the present technical disclosure, FIG. 3-2 is a sectional view along the line A-A of FIG. 3-1;

FIG. 4-1 to FIG. 4-4 are schematic diagrams illustrating preparation principle of the array substrate described in the embodiment of the present technical disclosure, in which FIG. 4-1 to FIG. 4-2 are sectional views of the area of thin film transistor.

DETAILED DESCRIPTION

Figure 1:
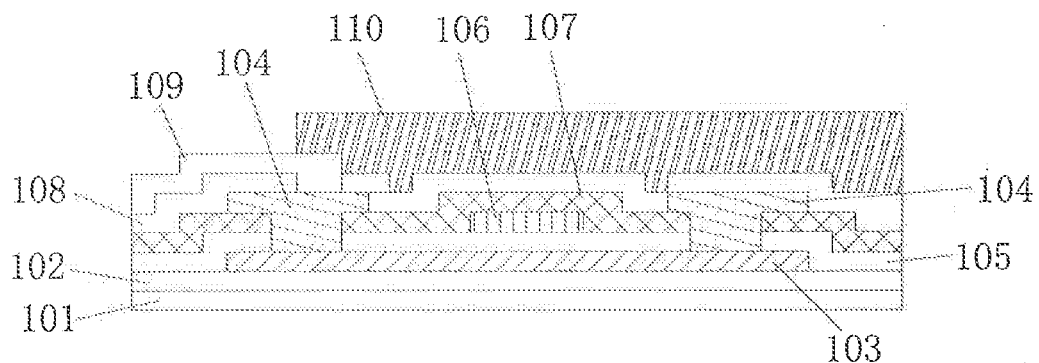
FIG. 1 is a structural schematic diagram of an LTPS TFT array substrate prepared by a conventional 7-Mask process.

Unless otherwise defined, technical or scientific terms used herein should be interpreted in the usual sense as understood by those ordinary skilled in the relevant art of the present technical disclosure. The terms "first", "second", and the like, used in this disclosure, do not denote any order, quantity, or importance, but are used to distinguish among different integral parts. Similarly, the words "a," "an," "the" and the like do not denote a limitation of quantity, but denote the presence of at least one of the referenced item. The words "comprising" or "including" or the like, are referred to that the elements or objects which appear before these words encompass the elements or objects and their equivalents which are enumerated after these words, and do not exclude other elements or objects. The terms "connection" or "interconnection" or the like, are not limited to physical or mechanical connections, but may comprise electrical connection, whether direct or indirect. The terms "upper", "lower", "left", "right" and the like, are only used to indicate a relative positional relationship, which may be changed along with a change in an absolute position of a described object.

In an embodiment of the present technical disclosure, there is provided an array substrate, comprising: a base substrate, a Poly-Silicon layer, a gate insulating layer and a metal layer. The Poly-Silicon layer is disposed above the base substrate, and comprises a channel region and ion-doped regions on both sides of the channel region; the gate insulating layer is disposed on the Poly-Silicon layer. The metal layer comprises a gate electrode, a source electrode, a drain electrode, a gate line and a data line, which are made of a same layer of metallic material.

For example, the gate electrode is electrically connected to the gate line; the source electrode and the drain electrode are electrically connected with the ion-doped regions respectively through via-holes in the gate insulating layer. The drain electrode is also connected to the data line.

For example, the gate line is broken at an intersection with the data line, and the broken gate line is electrically connected by a connection electrode above the metal layer; or, the data line is broken at an intersection with the gate line, and the broken data line is connected by a connection electrode above the metal layer.

For example, the array substrate may further comprise a passivation layer; the passivation layer is disposed on the metal layer, and the connection electrode connects the broken gate line or the broken data line through via-holes in the passivation layer.

For example, the array substrate may further comprise: a pixel electrode; the pixel electrode and the connection electrode are formed of a same layer of material.

For example, the pixel electrode is connected with the source electrode through a via-hole in the passivation layer.

For example, the array substrate may further comprise: a pixel electrode edge protection layer, which is disposed above the pixel electrode, the connection electrode and the passivation layer.

In the array substrate according to the embodiment of the present technical disclosure, since the metal layer comprises the gate electrode, the source electrode, the drain electrode, the gate line and the data line, which are made of a same layer of metallic material, they can be formed in a same patterning process; thus it can reduce the number of used Masks and simplify the preparation process.

Below, with reference to the drawings, the array substrate according to an embodiment of the present technical disclosure is described in detail.

Figures 1, 2:
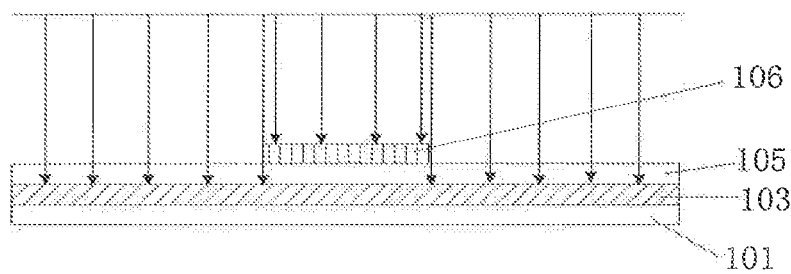
Figure 2:
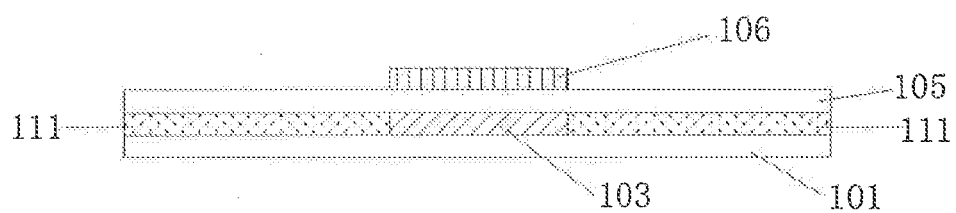
Figures 2, 3:
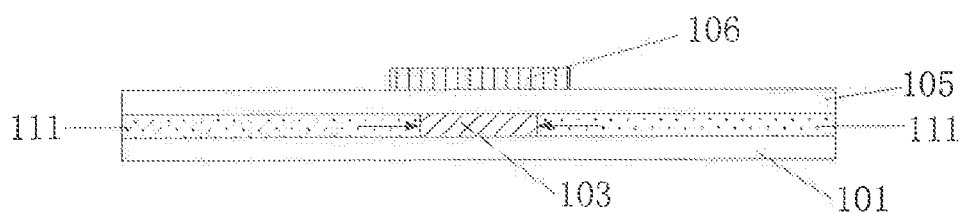
Figures 1, 3:
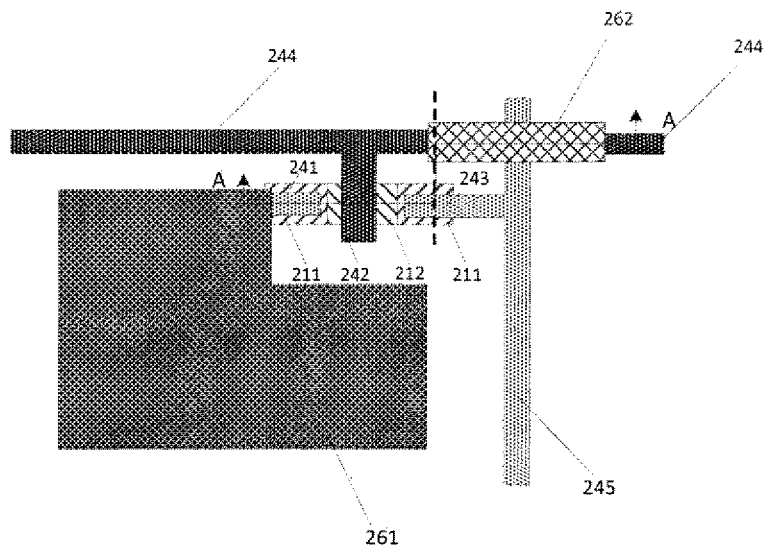
Figures 2, 3:
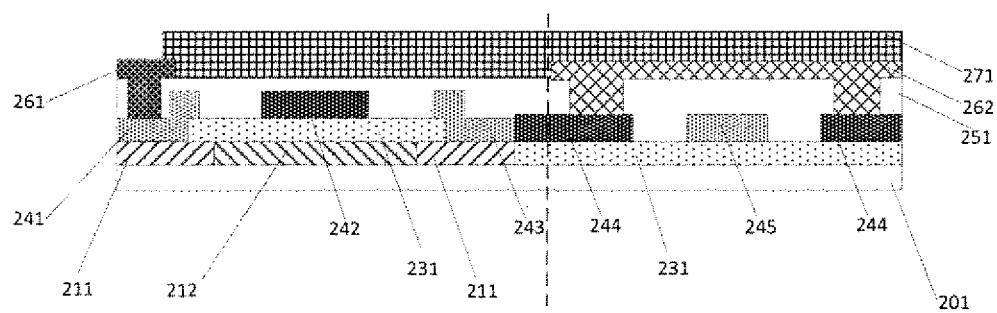

As illustrated in FIG. 3-1, FIG. 3-2, and FIG. 3-3, the array substrate in accordance with an embodiment of the present technical disclosure comprises from bottom to top: a base substrate 201, a Poly-Silicon layer, a gate insulating layer 231, a metal layer, a passivation layer 251, a pixel electrode 261, a connection electrode 262 and a pixel electrode edge protective layer 271. The pixel electrode edge protective layer 271 is applicable for an LTPS AMO LED; but an LTPS LCD may not comprise such a layer.

The Poly-Silicon layer is disposed above the base substrate 201, which comprises a channel region 212 and ion-doped regions 211. The ion-doped regions 211 are located on both sides of the channel region 212, corresponding to a source region and a drain region. Between the Poly-Silicon layer and the base substrate 201, there may be further provided a buffer layer (not illustrated).

The gate insulating layer 231 is disposed on the Poly-Silicon layer.

For example, the metal layer comprises a source electrode 241, a gate electrode 242, a drain electrode 243, a gate line 244 and a data line 245, which are made of a same layer of metallic material, The source electrode 241 is connected to the ion-doped region 211 on one side of the channel region 212, through a source via-hole in the gate insulating layer 231. The gate electrode 242 is disposed above the gate insulating layer 231. The drain electrode 243 is connected to the ion-doped region 211 on the other side of the channel region 212, through a drain via-hole in the gate insulating layer 231. The gate line 244 connects the gate electrode 242, and because the gate line and the data line are formed by using a same layer of metallic material, in order to insulate them from each other, the gate line 244 adopts a discontinuous design, that is, the gate line 244 is broken at an intersection with the data line 245, and the broken gate lines 244 on both sides of the data line 245 are electrically connected together again by the connection electrode 262. The data line 245 connects the drain electrode 243, and the data line 245 is continuous.

The passivation layer 251 is disposed above the metal layer, and for example, its material may be $SiN_x/SiO_2$. In the passivation layer 251, there are provided via-holes, for example, comprising a first via-hole and second via-holes; the first via-hole is used to connect the source electrode 241 with the pixel electrode 261, and the second via-holes are used to connect the broken gate line 244.

The pixel electrode 261 and the connection electrode 262 are disposed on the passivation layer 251. The pixel electrode 261 is electrically connected with the source electrode 241, through the first via-hole on the passivation layer 251. The connection electrode 262 connects the broken gate lines 244 on both sides of the data line 245, through the second via-holes on the passivation layer 251. That is, the connection electrode 262 acts as a connecting bridge for the broken gate lines 244, thereby achieving an intersectional design between the gate line 244 and the data line 245 in a same layer. For example, the pixel electrode 261 and the connection electrode 262 are formed of a same layer of material, which may be a transparent electrode material such as indium tin oxide (ITO), indium zinc oxide (IZO), etc.

For an LTPS AMOLED, the pixel electrode edge protective layer 271 is further disposed above the pixel electrode 261, the connection electrode 262 and the passivation layer 251, for protecting an organic layer later formed above the pixel electrode 261.

In another embodiment, at an intersection of the gate line 244 and the data line 245, in order to make them insulated, it may also possible that the data line 245 is designed in a discontinuous form while the gate line 244 is designed in a continuous form, so that through the second via-holes in the passivation layer, with the connection electrode for connecting the broken data lines on both sides of the gate line, ultimately an intersectional design between the gate line and the data line in a same layer can be achieved.

Another embodiment of the present technical disclosure further provides a display device comprising the array substrate described above. The display device is for example an LTPS AMOLED or an LTPS LCD. The LTPS LCD, in addition to the array substrate, further comprises a counter substrate; the array substrate and the counter substrate are disposed opposing to each other to form a liquid crystal cell, with liquid crystal material filled in the liquid crystal cell. An example of the counter substrate is a color filter substrate. In some examples, the liquid crystal display device further comprises a backlight which provides backlight for the array substrate.

Another embodiment of the present technical disclosure further provides a method of manufacturing an array substrate, and the method comprises the following processes.

(S1) On a base substrate 201, a Poly-Silicon layer pattern is formed, and the Poly-Silicon layer pattern comprises a channel region 212 and ion-doped regions 211 on both sides of the channel region 212.

For example, on the base substrate 201, a layer of $SiN_x/SiO_2$ buffer layer can be further formed by way of chemical vapor deposition (CVD) or the like; and on the buffer layer, a layer of amorphous silicon thin film may be formed by way of chemical vapor deposition, then the amorphous silicon thin film is converted into a polycrystalline silicon thin film by means of LTPS crystallization (such as ELA, MIC, SPC or the like). The Poly-Silicon thin film is coated thereon with photoresist, and with a P-Si Mask (a first Mask), the photoresist layer is exposed; after exposure, the photoresist layer is developed to obtain a photoresist pattern; after development, with the photoresist pattern as an etching mask, the Poly-Silicon thin film is etched; finally, by removing the photoresist pattern, a Poly-Silicon layer pattern is obtained. The base substrate 201 may be a glass substrate or a plastic substrate. In one example, the buffer layer may not be formed; instead, the Poly-Silicon layer pattern is directly formed on the base substrate 201.

(S2) A gate insulating layer pattern 231 is formed on the Poly-Silicon layer pattern, and by using photoresist coated above the channel region 212 as a barrier layer, ion-doping is performed with respect to the ion-doped region 211.

Further, the process (S2) may further comprise: an annealing process, after ion-doping is performed to the ion-doped region.

Figures 1, 4:
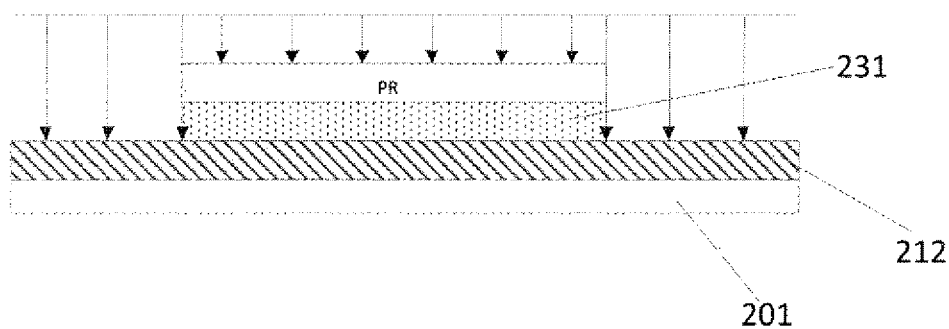
Figure 3:
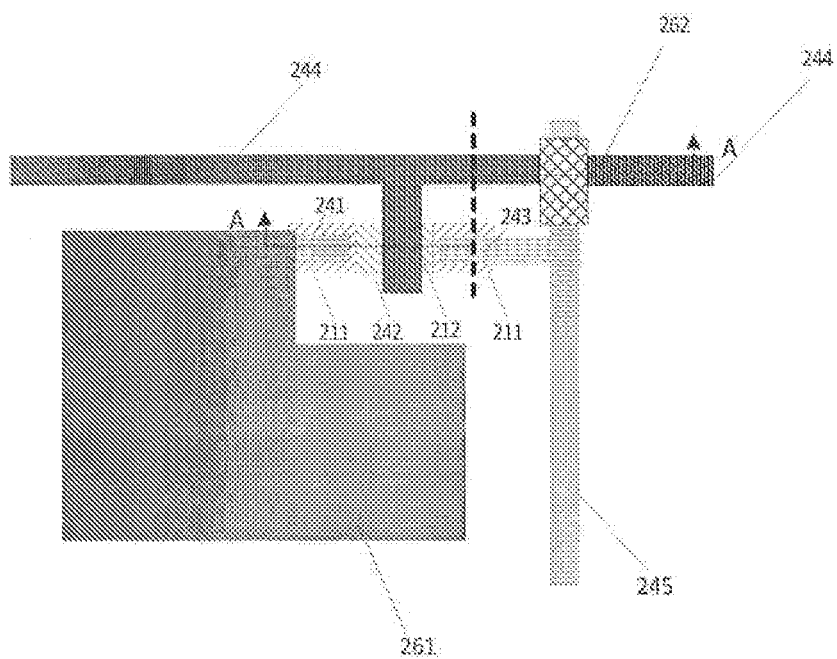
Figures 2, 4:
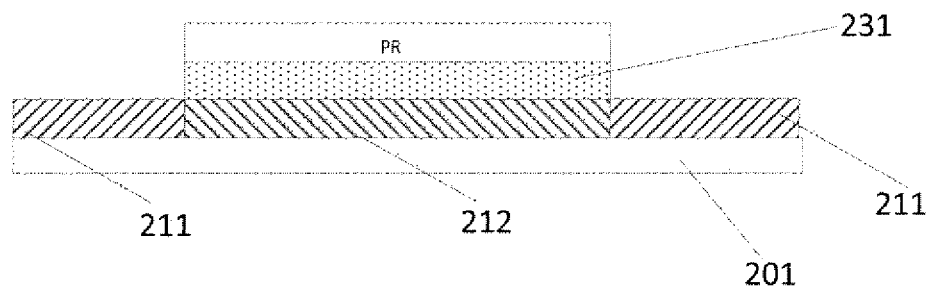
Figures 3, 4:
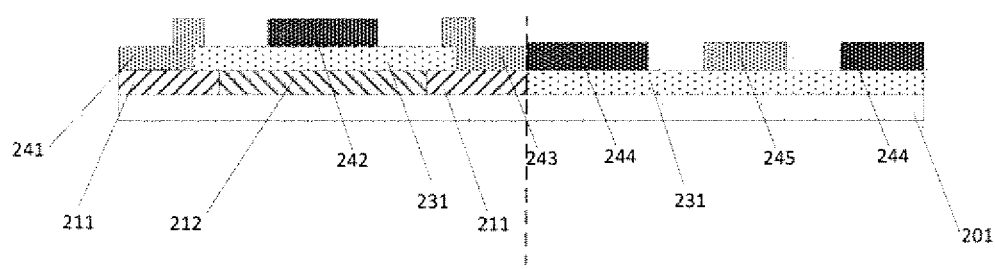
Figure 4:
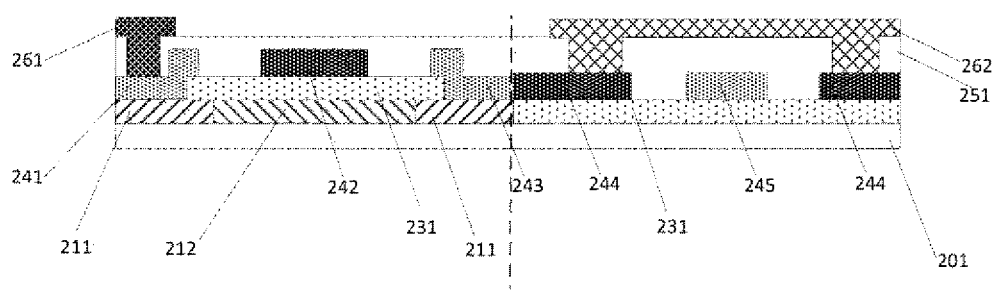

For example, a gate insulating layer thin film may be formed on the Poly-Silicon layer pattern by way of chemical vapor deposition or the like, and the gate insulating layer thin film may be $SiO_2/SiNx$; after the gate insulating layer thin film is coated thereon with photoresist, with a gate insulating layer via-hole Mask (a second Mask), exposure is performed to form a pattern of both a source via-hole and a drain via-hole; through development after exposure, a photoresist pattern is obtained. After development, with the photoresist pattern on the channel region 212 as a barrier layer for ion-doping, ion-doping is performed with respect to the doping region 211. The ion-doping may be performed immediately after the photoresist pattern is obtained through development, and it also may be performed after etching for the source via-hole and the drain via-hole with the photoresist pattern as an etching mask. For instance, in one example, the latter process is adopted. After development, with the photoresist pattern as an etching mask, the gate insulating layer is etched to form a pattern of both the source via-hole and the drain via-hole, so as to obtain the source via-hole and the drain via-hole which respectively expose a source region and a drain region in the polycrystalline silicon layer; after etching, ion-doping is performed, as illustrated in FIG. 4-1. The source region and the drain region are separated by the gate insulating layer therebetween. After ion-doping, the ion-doped regions 211 are formed in the Poly-Silicon layer, as illustrated in FIG. 4-2. After ion-doping, the photoresist is removed. Then, if necessary, an annealing process may be further performed. During the annealing process, dopant ions will also diffuse to the channel region 212; however, because the locations of both the source via-hole and the drain via-hole in the gate insulating layer 231 can be utilized to independently adjust the distances from the source via-hole and the drain via-holes to the channel region 212, so that during ion-doping, the source electrode 241 and the drain electrode 243 can be selected to each have a certain distance to the channel region 212 according to designing requirements, and therefore this process reduces the influence of ion-diffusion resulted from the annealing process upon the effective length of the TFT channel region, reduces the contact area of the gate electrode and the source-drain electrodes (source and drain electrodes), and reduces the coupling capacitance between the gate electrode and the source-drain electrodes.

(S3) A metal layer is formed on the gate insulating layer; and by using the metal layer, a gate electrode, a source electrode, a drain electrode, a gate line and a data line are formed.

An example of the step S3 comprises: a metal layer is formed on the gate insulating layer, and by using the metal layer, a gate electrode, a source electrode, a drain electrode, a gate line and a data line are formed; the source electrode is connected with the ion-doped region below the source electrode, through the source via-hole in the gate insulation layer; the drain electrode is connected with the ion-doped region below the drain electrode, through the drain via-hole in the gate insulation layer; the gate electrode is located above the Poly-Silicon layer pattern that acts as an active layer, and the gate electrode is connected with the gate line; the drain electrode is connected with the data line; the gate line is broken at an intersection with the data line, as illustrated in FIG. 4-3. At this point, the gate electrode, the source electrode, the drain electrode, the gate line and the data line are formed by a same metal layer.

For example, on the basis of the pattern formed through the second mask, a metal layer thin film is formed by means of sputtering or the like; then, the metal layer thin film is coated thereon with photoresist, and the photoresist layer is exposed with a third mask; thereafter, after development, etching and photoresist-removing, the patterns for all of the gate electrode 242, the source electrode 241, the drain electrode 242, the gate line 244, as well as the data line 245, are completed. Since the gate line and data line are formed by a same metal layer, it is necessary to break one of the lines at an intersection of the gate line and the data line, in order to insulate them from each other. In this embodiment, it adopts the mode of breaking gate line, and it may also adopt the mode of breaking data line. Correspondingly, during the subsequent process of forming a pixel electrode pattern, a connecting electrode may be formed, so as to connect the broken gate line or the broken data line together.

Additionally, the method may further comprise the following steps.

(S4) A passivation layer is formed above the metal layer 251, and via-holes are formed in the passivation layer 251. The via-holes of the passivation layer are used to connect the pixel electrode 261 and the source electrode 241, and connect the broken gate line 244 or connect the broken data line 245.

For example, a passivation layer thin film is formed above the metal layer, by chemical vapor deposition, and with the fourth mask, a via-hole pattern is formed in the passivation layer thin film through a patterning process. The patterning process comprises steps such as photoresist coating, development, etching and photoresist-removing, etc.; the formed via-holes are used for connecting the pixel electrode and the source electrode, and connect the broken gate line or connect the broken data line.

(S5) A pixel electrode 261 and a connection electrode 262 are formed on the passivation layer 251. The via-holes in the passivation layer comprise a first via-hole and second via-holes; the pixel electrode 261 is connected to the source electrode 241 through the first via-hole in the passivation layer; the connection electrode 262 connects the broken gate line 244 through the second via-holes in the passivation layer, as illustrated in FIG. 4-4.

For example, a transparent electrode thin film is formed on the passivation layer by sputtering, etc., and the thin film may be an indium tin oxide (ITO) thin film. With the fifth Mask, through a patterning process, the transparent electrode thin film is formed into a pattern of both the pixel electrode and the connection electrode. The patterning process comprises steps such as photoresist coating, development, etching, photoresist-removing, etc.

The pixel electrode is connected to the source electrode through the first via-hole in the passivation layer; the connection electrode connects the broken gate line, through the second via-holes in the passivation layer.

For an LTPS AMOLED, the method may further comprise the following process.

(S6) A pixel electrode edge protective layer 271 is formed above the pixel electrode 261, the connection electrode 262 and the passivation layer 251, for protecting an organic layer above the pixel electrode; and the array substrate formed after this step is illustrated in FIG. 3-2.

For example. a protective layer thin film is formed above the pixel electrode 261, the connection electrode 262 and the passivation layer 251, by way of chemical vapor deposition or the like; with the sixth Mask, through a patterning process, a pattern for the pixel electrode edge protective layer is formed, and the patterning process comprises steps such as photoresist coating, development, etching and photoresist-removing, etc.

Further, in the step (S3), it is also possible to have the data line 245 broken at an intersection with the gate line 244, while make the gate line 244 continuous; accordingly, in the step (S5), the connection electrode 262 can be adopted to connect the broken data line 245 through the second via-holes in the passivation layer.

For the array substrate, the display device, and the manufacturing method according to the embodiments of the present technical disclosure, ion-doping is performed by using photoresist as a barrier layer in lieu of using the gate electrode as a barrier layer, which can reduce the short channel effect that is caused by diffusion of the doped ions toward the channel region, decreases the coupling capacitance between the gate and the source-drain, and thereby improving the TFT performance. In addition, since the patterning process to a same metal layer is adopted, it also can reduce the number of the used Masks and simplify the preparation process.

The above embodiments are merely used to explain the present technical disclosure, instead of limit the present technical disclosure. A variety of modifications and variations can be made by the ordinary skilled in the related art, without departing from the spirit and the scope of the present technical disclosure; therefore all equivalent technical schemes should belong to the present technical disclosure, and the actual scope of the present technical disclosure should be defined by the claims.

What is claimed is:

1. An array substrate, comprising:
a base substrate, a Poly-Silicon layer, a gate insulating layer and a metal layer;
wherein the Poly-Silicon layer is disposed above the base substrate, and comprises a channel region and ion-doped regions on both sides of the channel region, respectively;
the gate insulating layer is disposed on the Poly-Silicon layer;
the metal layer comprises a gate electrode, a source electrode, a drain electrode, a gate line and a data line, which are made of a same layer of metallic material,
wherein the gate electrode the source electrode, the drain electrode, the gate line and the data line are on the gate insulating layer, and
a maximum area of the channel region is broader than that of the gate electrode.

2. The array substrate according to claim 1, wherein the gate line is broken at an intersection with the data line, and the gate line is connected at the intersection by a connection electrode above the metal layer; or
the data line is broken at the intersection with the gate line, and the data line is connected at the intersection by the connection electrode above the metal layer.

3. The array substrate according to claim 2, further comprising a passivation layer;
wherein the passivation layer is disposed above the metal layer, and the connection electrode connects the gate line or the data line through via-holes in the passivation layer.

4. The array substrate according to claim 2, further comprising: a pixel electrode,
wherein the pixel electrode and the connection electrode are formed of a same layer of material.

5. The array substrate according to claim 4, wherein the pixel electrode connects the source electrode through a via-hole in the passivation layer.

6. The array substrate according to claim 4, further comprising: a pixel electrode edge protection layer which is disposed above the pixel electrode, the connection electrode and the passivation layer.

7. The array substrate according to claim 1, wherein the gate electrode connects the gate line; the source electrode and the drain electrode are connected with the ion-doped regions respectively through via-holes in the gate insulating layer.

8. A display device, comprising:
an array substrate, wherein the array substrate comprises:
a base substrate, a Poly-Silicon layer, a gate insulating layer and a metal layer;
wherein the Poly-Silicon layer is disposed above the base substrate, and comprises a channel region and ion-doped regions on both sides of the channel region, respectively;
the gate insulating layer is disposed on the Poly-Silicon layer;
the metal layer comprises a gate electrode, a source electrode, a drain electrode, a gate line and a data line, which are made of a same layer of metallic material,
wherein the gate electrode the source electrode, the drain electrode, the gate line and the data line are on the gate insulating layer, and
a maximum area of the channel region is broader than that the gate electrode.

* * * * *